United States Patent [19]

Kuhn

[11] Patent Number: 5,111,146
[45] Date of Patent: May 5, 1992

[54] COIL SYSTEM FOR VOLUME-SELECTIVE MAGNETIC RESONANCE SPECTROSCOPY

[75] Inventor: Michael H. Kuhn, Hamburg, Fed. Rep. of Germany

[73] Assignee: U.S. Philips Corporation, New York, N.Y.

[21] Appl. No.: 529,987

[22] Filed: May 29, 1990

[30] Foreign Application Priority Data

May 31, 1989 [DE] Fed. Rep. of Germany ....... 3917619

[51] Int. Cl.⁵ ............................................. G01R 33/20
[52] U.S. Cl. ..................................... 324/318; 324/322
[58] Field of Search ............... 324/300, 307, 309, 310, 324/311, 313, 314, 318, 322; 128/653 A

[56] References Cited

U.S. PATENT DOCUMENTS

| | | | |
|---|---|---|---|
| 4,721,914 | 1/1988 | Fukushima et al. | 324/320 |
| 4,737,717 | 4/1988 | Petro | 324/318 |
| 4,737,754 | 4/1988 | Goldie | 324/320 |
| 4,752,738 | 6/1988 | Patrick et al. | 324/309 |
| 4,843,549 | 6/1989 | McKinnon . | |
| 4,862,087 | 8/1989 | Hillenbrand et al. | 324/320 |

OTHER PUBLICATIONS

"Magnetic Field Mapping and NMR Imaging by Multi--Frequency SENEX", by M. Braun, W. I. Jung, O. Lutz and R. Oeschey.

Primary Examiner—Michael J. Tokar
Attorney, Agent, or Firm—William Squire

[57] ABSTRACT

A coil system is disclosed which is particularly suitable for volume-selective MR spectroscopy. In addition to the coil for generating the RF pulses and for receiving the MR spin resonance signals, the coil system comprises a correction coil which receives a direct current so that this coil generates an inhomogeneous field which compensates for inhomogeneities of the steady magnetic field in the selected volume. As a result, the magnetic field in this zone becomes homogeneous to such an extent that spectroscopic examinations can also be performed in zones in which the magnetic susceptibility varies strongly in space.

10 Claims, 1 Drawing Sheet

COIL SYSTEM FOR VOLUME-SELECTIVE MAGNETIC RESONANCE SPECTROSCOPY

FIELD OF THE INVENTION

The invention relates to a coil system for volume-selective magnetic resonance spectroscopy, comprising an RF coil which can be connected to an RF generator and/or an RF receiver in order to generate and/or receive magnetic RF fields signals.

BACKGROUND OF THE INVENTION

For volume-selective magnetic resonance spectroscopy, the spin resonance signals generated in a small zone (the selected volume) within a patient being examined are subjected to a spectral analysis. The spectra thus obtained provide information as regards the substances contained in the selected volume. Methods of this kind, including the coil systems required, are known (for example, see EP-OS 233 675 corresponding to U.S. Pat. No. 4,843,549). These coil systems comprise either a single RF coil for generating magnetic RF pulses and for receiving the spin resonance signals generated in the relevant volume, or separate RF coils for generating RF pulses on one hand and for receiving the spin resonance signals on the other hand.

As is known, examinations of this kind are performed in the presence of a strong, steady magnetic field, it being extremely important that this magnetic field is homogeneous in the volume to be examined. The deviation of the magnetic field from its mean value must be substantially less than 1 ppm throughout the volume examined.

In order to improve the homogeneity, use is made of so-called shim coils whose direct currents are individually adjusted so that overall an as homogeneous as possible field is obtained. These coils, being permanently incorporated in the MR examination apparatus, comprise an opening which is sufficiently large to accommodate a patient to be examined.

However, it has been found that the homogeneity that can be achieved by means of these shim coils is limited and that, even if the patient were introduced into an exactly homogeneous magnetic field, the magnetic field within the patient would exhibit an inhomogeneity of several ppm. This is due to strong, local variations of the magnetic susceptibility, which force the magnetic field out of the human body.

SUMMARY OF THE INVENTION

It is the object of the present invention to achieve a further reduction of the inhomogeneities of the magnetic field.

Using a coil system of the kind set forth, this object is achieved in accordance with the invention in that at a defined distance in space from the RF coil there is arranged a correction coil which can be connected to a DC source and which generates a spatially varying magnetic field in the zone exposed to the RF coil.

When the coil system is suitably arranged and the direct current through the correction coil is suitably adjusted, it can be achieved that, at least in a small volume, the inhomogenous variation of the magnetic field exactly compensates for the corresponding variation occurring in the absence of this coil. Thus, the homogeneity of the magnetic field can be improved to such an extent that spectroscopic examinations are also possible in the zones of the human body in which great differences in susceptibility occur.

BRIEF DESCRIPTION OF THE DRAWING

The invention will be described in detail hereinafter with reference to the drawing. Therein

DESCRIPTION OF THE PREFERRED EMBODIMENT

Figure 1:
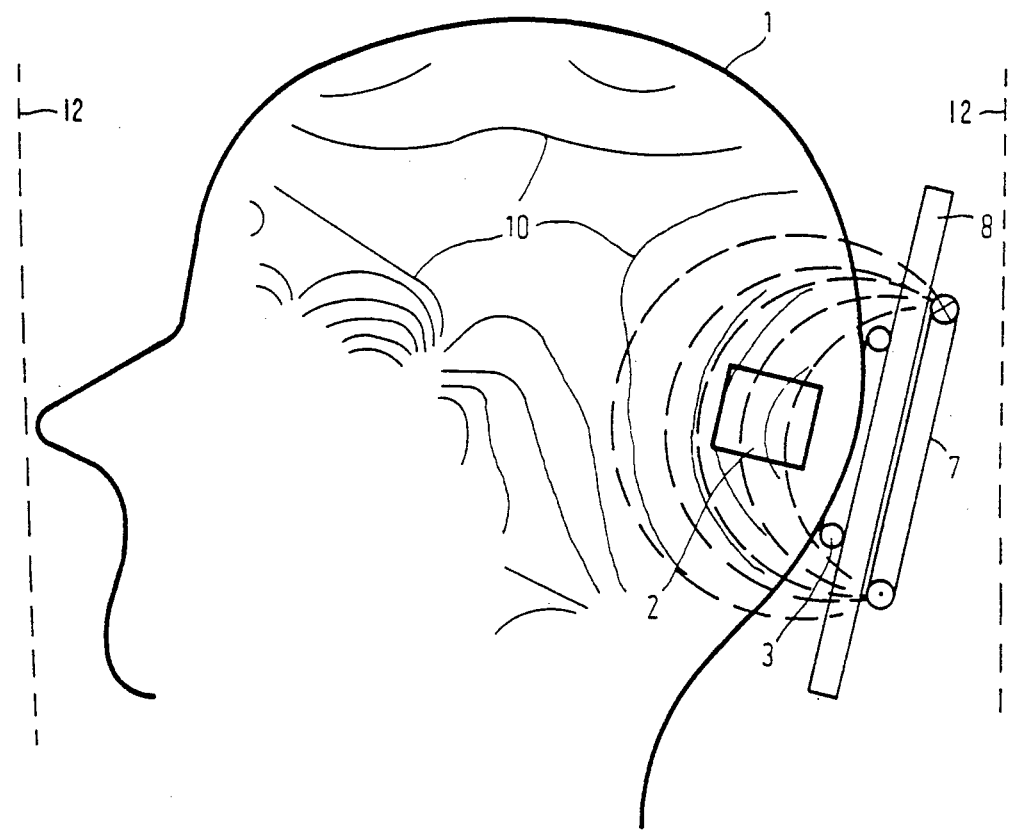
FIG. 1 shows a coil system in accordance with the invention during examination of the human skull.

The reference numeral 1 in FIG. 1 denotes a human skull in which a volume 2 is to be spectroscopically examined. During examination, the skull is situated within a magnet 12 (shown as dashed lines) which generates a uniform, steady magnetic field having a magnetic flux density of, for example 4 Tesla. Because of varying magnetic susceptibility inside and outside the skull, the magnetic field is forced out of the interior of the head, i.e. it decreases in the inwards direction. The thin lines 10 in the drawing interconnect the locations of equal magnetic field strength, a difference in field strength of 0.16 ppm existing between neighboring lines. It appears that a substantially uniform field occurs in the central region of the brain, the magnetic field at the rear of the skull and notably also at the area of the eye sockets, being substantially inhomogeneous. Thus far, magnetic resonance spectroscopic examinations could not be performed in this part of the skull.

For the spectroscopic examination of a volume 2 at the rear of the skull, a coil system is arranged at the area of the rear skull wall, which coil system comprises an RF coil 3 which is constructed as a flat surface coil and which may have an annular shape. The RF coil 3 is capable of generating RF pulses as well as of detecting spin resonance signals arising in the volume 2.

Figure 2:
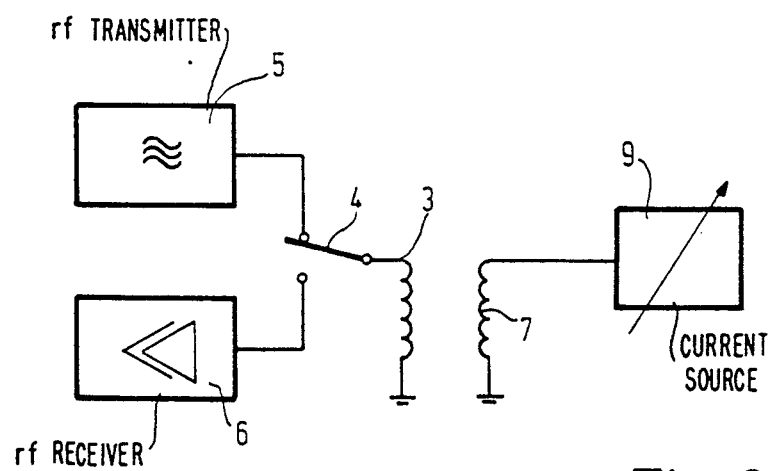
FIG. 2 shows a block diagram illustrating the electrical connections of these coils.

As is shown in FIG. 2, to this end the RF coil 3 can be connected to an RF transmitter 5 or to an RF receiver 6, via a switch 4. However, it is alternatively possible to use the RF coil 3 only for reception and to use a further RF coil, for example a so-called head coil which encloses the head of a patient, for generating the RF pulses. The volume 2 is selected by means of gradient coils (not shown) which are capable of generating magnetic fields having constant gradients, for example as disclosed in EP-A 233 675

The coil system also comprises a further flat coil 7 which is referred to as correction coil hereinafter and which occupies a spatially defined position with respect to the RF coil 3. To this end, the two flat coils 3 and 7 are mounted in parallel planes on respective opposite sides of a plate-shaped carrier 8 which consists of a suitable radiation transparent material (for example plexiglass). The correction coil 7 is connected to a current source 9 whose current can be adjusted as regards amplitude and polarity.

The broken lines in FIG. 1 represent the lines 11 of equal field strength which occur when the steady, homogeneous magnetic field required for the examination is deactivated and a direct current flows only through the correction coil 7. The magnetic field strength also decreases towards the interior of the skull in a non-linear fashion, and it appears that the broken lines at the area of the rear part of the skull have approximately the same shape as the thin, non-interrupted lines 10 of equal magnetic field strength which result (exclusively) from the homogeneous, steady external magnetic field. By suitably choosing the current direction and the amplitude of the direct current in the correction coil 7, therefore, the inhomogeneity of the steady magnetic field, caused by the differences in the magnetic susceptibility, can be at least substantially compensated for by the inhomogeneity of the magnetic field caused by the correction coil, at least in the volume 2 and its immediate vicinity. The resultant magnetic field at this area, therefore, becomes so homogeneous that the spin resonance signals generated in this zone are suitable for spectroscopic analysis.

Because similar inhomogeneities always occur in a given position of the skull for a comparable anatomy of different patients, the coil system comprising coils 3, 7 is suitable for the spectroscopic examination of the entire rear skull. Coil systems of this kind can also be used for other anatomic regions, be it that substantially more complex structures may be required, depending on the degree of inhomogeneity; however, for a known field distribution inside the patient such more complex structures can also be calculated by means of corresponding calculation programs.

The simplest way to adjust the correct current consists in varying the current step-wise, each time one or more sequences for volume selection being generated, followed by analysis of the decay time or the line width of the resultant spin resonance signal, and ultimately leaving the current adjusted to the value for which the smallest line width or the longest decay time occurs. The adjustment thus found can be checked, if necessary, by means of the known method where the sequences are composed so that the lines of equal field strength become visible in the MR tomogram (see article entitled "Magnetic Field Mapping and NMR Imaging Multi-Frequency SENEX", M. Braun et al., Z. Naturforsch. 43a, pp. 291–296; 1988). Because of the comparatively small distance between the correction coil and the volume 2 to be examined, small coil currents suffice for producing the gradients of the magnetic field required in order to compensate for the inhomogeneities, so that the expenditure for the current source 9 is substantially smaller than for the current sources for powering the cited shim coils.

For volume selection it is necessary to switch gradient fields on and off during a sequence. These switching operations may cause interference signals in the correction coil 7. In order to avoid such signals, the correction coil 7 can be switched off during these switching operations. However, the field distribution is then influenced and hence also the selected volume. When the coil 7 is powered by an audio amplifier (having a sufficiently high internal resistance and at a frequency which is substantially lower than the RF frequency of the RF coil generated fields) instead of a direct current source, the interference signals induced in the coil 7 can be compensated for. To this end, the interference signals induced into the correction coil are recorded during a preliminary experiment (after the positioning of the patient) by means of an analog-to-digital converter and a memory which is suitably controlled by a microprocessor, after which these interference signals are inversely superposed on the direct current during the actual measurement.

What is claimed is:

1. A coil system for a volume-selective magnetic resonance spectroscopy arrangement, said arrangement including means for generating a steady-state magnetic field which exhibits variations in an object zone due to local variations of magnetic susceptibility in the object zone, said system comprising:
   a radio frequency RF coil adapted to be selectively connected to a selected one of an RF generator and an RF receiver to respectively generate magnetic RF fields or receive RF signals;
   a steady-state magnetic field correction coil at a defined distance in space from the RF coil; and
   a current source for supplying current at a frequency substantially lower than said radio frequency to the correction coil so that said correction coil generates a spatially varying magnetic field in the zone exposed to the RF coil generated fields.

2. A system as claimed in claim 1, characterized in that the RF coil is constructed as a surface coil.

3. A system as claimed in claim 2, characterized in that the two coils are mounted on a common carrier in parallel planes.

4. A system as claimed in claim 1, characterized in that the correction coil is adapted so as to eliminate local variations of magnetic susceptibility.

5. A system as claimed in claim 2 wherein the correction coil is adapted so as to substantially compensate for said magnetic field local variations due to the variations in said magnetic susceptibility.

6. A system as claimed in claim 3 wherein the correction coil is adapted so as to substantially compensate for said magnetic field local variations in said magnetic susceptibility.

7. A coil system for volume-selective magnetic resonance spectroscopy of an object comprising:
   means for generating a steady-state magnetic field which exhibits variations in an object zone due to local variations of magnetic susceptibility in the object zone;
   a first coil including means for at least receiving magnetic fields in the object under examination, said generated field tending to exhibit inhomogeneity due to said local variations in said object zone; and
   a second coil spaced from the first coil including means for substantially compensating for the field strength inhomogeneity in said object.

8. The system of claim 7 wherein said means for compensating includes current source means for applying a current to said second coil to generate a spatially varying field in the zone of the object exposed to the field of the first coil.

9. The system of claim 8 wherein said current source means includes means for selecting a current direction and amplitude applied to said second coil.

10. The system of claim 7 including means for selectively causing the first coil to operate as one of a radio frequency signal transmitter and a radio frequency receiver.

* * * * *